United States Patent
Smith

(10) Patent No.: US 7,149,261 B2
(45) Date of Patent: Dec. 12, 2006

(54) IMAGE REJECT CIRCUIT USING SIGMA-DELTA CONVERSION

(75) Inventor: Gary Smith, Eastleaze, W. Swindon (GB)

(73) Assignee: Matsushita Electric Industrial Co., Ltd., Osaka (JP)

( * ) Notice: Subject to any disclaimer, the term of this patent is extended or adjusted under 35 U.S.C. 154(b) by 647 days.

(21) Appl. No.: 10/023,309

(22) Filed: Dec. 15, 2001

(65) Prior Publication Data

US 2003/0138062 A1 Jul. 24, 2003

(51) Int. Cl.
*H04L 27/14* (2006.01)

(52) U.S. Cl. ...................................................... 375/324

(58) Field of Classification Search ................ 375/329, 375/316, 324
See application file for complete search history.

(56) References Cited

U.S. PATENT DOCUMENTS

| | | | | |
|---|---|---|---|---|
| 5,357,544 A | * | 10/1994 | Horner et al. | 375/340 |
| 5,808,509 A | * | 9/1998 | Baltus et al. | 329/300 |
| 5,828,955 A | | 10/1998 | Lipowski et al. | 455/324 |
| 6,233,287 B1 | | 5/2001 | Kelley et al. | 375/316 |
| 6,674,812 B1 | * | 1/2004 | Stevenson | 375/302 |
| 6,804,497 B1 | * | 10/2004 | Kerth et al. | 455/88 |
| 2002/0105378 A1 | | 8/2002 | Tapio | 330/10 |
| 2004/0223086 A1 | * | 11/2004 | Jaffe | 348/726 |

\* cited by examiner

*Primary Examiner*—Kevin Burd
*Assistant Examiner*—Freshteh N Aghdam
(74) *Attorney, Agent, or Firm*—McDermott, Will & Emery LLP

(57) ABSTRACT

In a digital IF downconversion circuit, in-phase and quadrature signal components are processed in the form of a single serial digital bit stream through a set of simple logic in combination with a reconstruction filter. A source digital oscillator supplying digital signal mixers employs an oversampled digital word of four bits in length, all of which are binary weighted, to achieve at least sixteen levels of accuracy for a sine wave mixing signal without significant phase or amplitude error. The mixer mixes the digitized serial bit stream according to the clock with output of a four-bit wide table representing the source oscillator and the in-phase and quadrature signals are recombined digitally, followed by binary weighting using weighted resistors coupled into a filter. Thus, image rejection is a digital function which is unaffected by resistor tolerance.

1 Claim, 3 Drawing Sheets

IMAGE REJECT CIRCUIT USING SIGMA-DELTA CONVERSION

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to digital IF downconversion and particularly to digital IF downconversion of relatively wide bandwidth signals at microwave frequencies.

Digital IF downconversion has the advantage of flexibility for multi-mode operation, such as is useful for multiple modes of cellular communication and controllable accuracy and thus good performance with wide bandwidth signals wherever the sampling rate and coefficient accuracy is adequate for the frequencies of interest. In typical operation, the full bandwidth range is captured in an analog-to-digital converter employing a bandpass sigma-delta converter, followed by a final digital filtering channel.

The challenge of processing a wideband digital IF converted signal is rejection of unwanted image and spurious signals which when they occur on the frequency of interest block the desired signal (and hence are called blockers). For this purpose, a DSP filter that is programmed for the appropriate mode of operation is commonly used following wideband downconversion.

FIG. 1 illustrates one typical configuration of a downconverter circuit 100 with an image reject stage. Radio Frequency (RF) signals are processed through an in-phase (I) channel 102 and a quadrature phase channel 104 implemented by downconverting mixers 106 and 108 referenced to an analog reference signal of an analog source 110, wherein the reference signals are precisely 90 degrees out of phase (as represented by a 90 degree or $\pi/2$ delay element 112). The reference signal has a typical operating frequency of 100 kHz below the nominal RF frequency. The analog signals are processed through conventional sigma-delta analog to digital converters 114, 116 to produce respective one-bit wide serial bit streams. Each channel of the circuit 100 includes a decimator 118, 120 to convert the high-speed serial bit streams to parallel bit streams. There are typically four or eight parallel streams in each path. The parallel bit streams are each supplied to respective fractional filters to make the sampling integer in nature. There is a corresponding compensation filter function for extracting the desired signal of the defined bandwidth. These two functions may be combined in a digital finite impulse response (FIR) filter 122, 124 whose characteristics are defined by a set of filter coefficients.

It is known that out-of-bandwidth attenuation degrades as fewer bits are used to represent filter coefficients. Thus, overall performance depends on the number of bits employed to represent the filter characteristic. The outputs of the FIR filters 122, 124 are mixed and summed digitally in a mixing/summing stage 126 to cancel the unwanted components and to generate as output I and Q multi-bit digital bit streams representing the pure I component and the pure Q component of the wanted signal with maximum image rejection. The digital I and Q components are then processed through digital-to-analog converters 128, 130 (operating at the Nyquist rate) to recover the signal as I and Q analog components 132, 134 at baseband.

This conventional image cancellation scheme has a number of practical drawbacks. According to the conventional approach, in order to achieve targeted performance levels, it has been a practice to use relatively power-consumptive parallel processing techniques operative on the in-phase and quadrature signal components in the form of digital word streams. Not only do these techniques consume more power than is desirable, they also require deployment of relatively large integrated circuits. In a typical configuration, the decimators 118, 120, FIR filter 122, 124, the summing stage 126 and the DACs 128, 130 require on the order of 25,000 gates to implement, which translates to almost 3 square millimeters of valuable circuit area and relatively high power consumption. Both power and circuit size are premium in a portable battery operated digital device such as a cellular telephone.

A representative description of one published prior art implementation is Rudell et al., "A 1.9 GHz Wide-Band IF Double Conversion CMOS Receiver for Cordless Telephone Applications," *IEEE Journal of Solid-State Circuits,* Vol. 32, No. 12, December 1997.

Another representative reference is Canadian patent application 2,284,948 published Apr. 4, 2001 of Birkett et al.

What is needed is a more efficient image reject circuit in a digital IF downconversion circuit for a portable digital device such as a cellular telephone.

SUMMARY OF THE INVENTION

According to the invention, in a digital IF downconversion circuit, in-phase and quadrature signal components are processed in the form of a parallel channels of single serial digital bit stream through a set of simple logic elements, such as a novel grouping of Exclusive OR gates, AND gates and OR gates, operating as adders and multipliers in combination with a "reconstruction filter" to recover the analog in-phase and quadrature phase baseband components substantially free of images. In a preferred embodiment, the two bit streams output from I and Q sigma-delta A/D converter are split and then each exclusive-ORed with both a high accuracy sine function and a cosine function bit stream, then the outputs of the XOR gates are each both ORed together and ANDed together. This Boolean product and this Boolean sum are then each binary weighted and combined in a reconstruction filter formed of weighting resistors that are combined with other weighted outputs to form respective analog I and Q channel signals at baseband.

Further specifically according to the invention, a source digital oscillator supplying digital signal mixers employs an oversampled digital word of four bits in length, all of which are binary weighted relative to one another, to achieve at least sixteen levels of accuracy for a sine wave mixing signal without significant phase or amplitude error. The mixer mixes the digitized serial bit stream according to the clock with output of a four-bit wide digital cosine/sine table representing the source oscillator by means of a simple exclusive OR, and the in-phase and quadrature signals are recombined digitally using a simple AND and OR summer, followed by binary weighting using weighted resistors coupled into a filter. Thus, image rejection is a digital function which is unaffected by resistor tolerance.

The invention will be better understood by reference to the following detailed description in connection with the accompanying drawings.

DETAILED DESCRIPTION OF THE INVENTION

Figure 1:
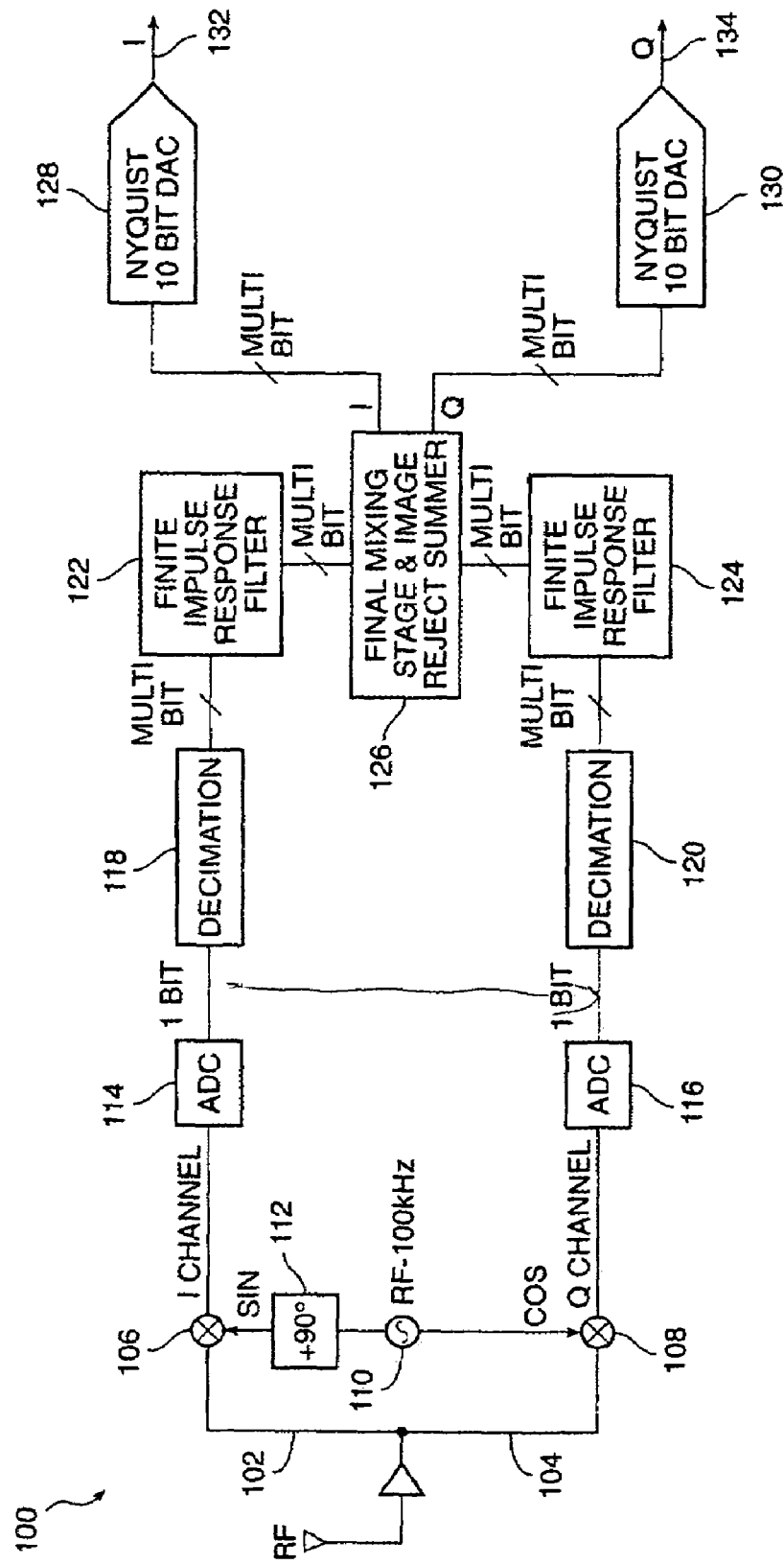
FIG. 1 is a block diagram of a prior art digital RF downconverter.
Figure 2:
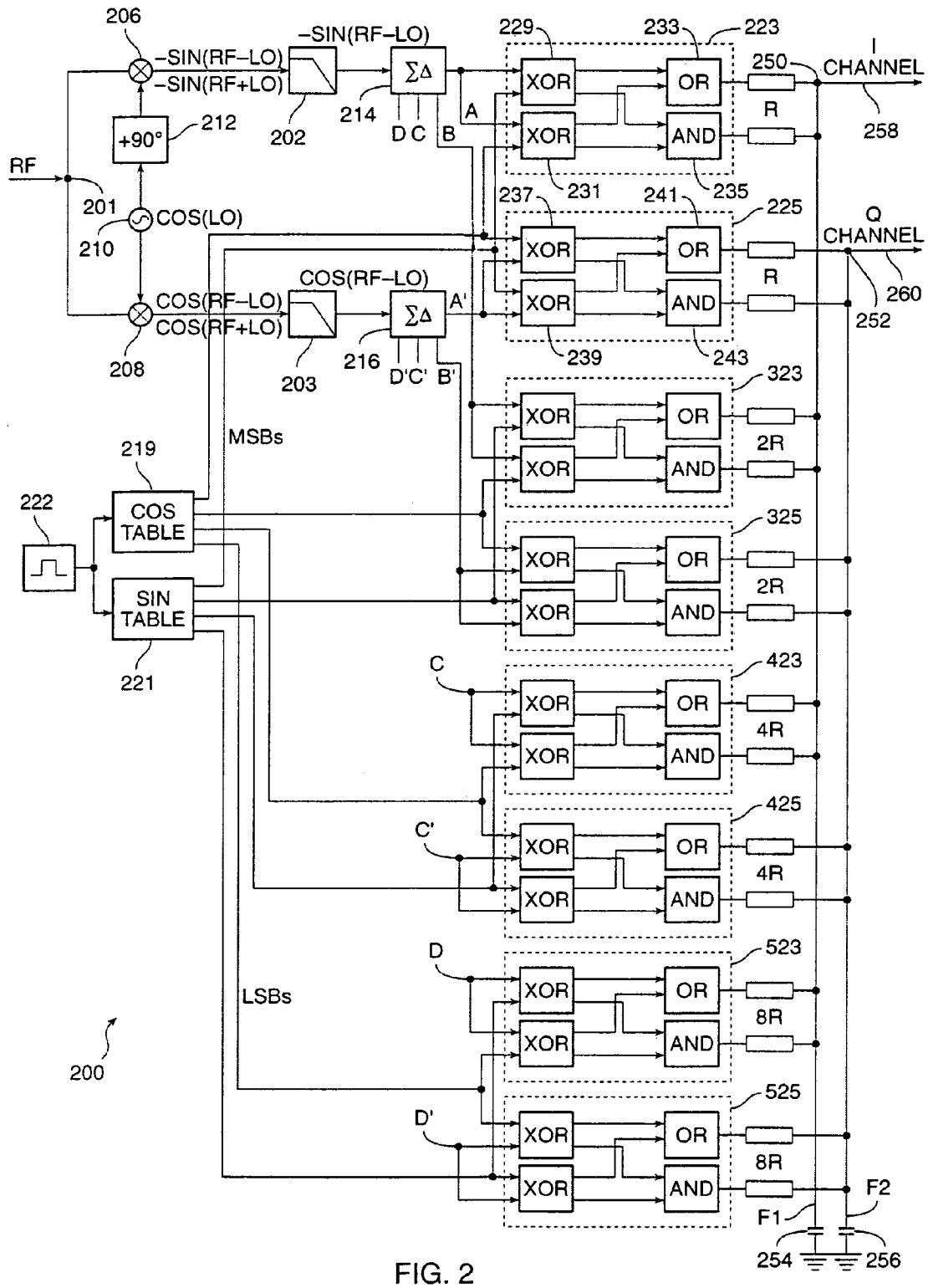
FIG. 2 is a block diagram of a digital RF down converter according to the invention.

Referring to FIG. 2, a sigma delta low IF image reject circuit 200 according to the invention is shown. Not shown is the front end of the receiver, which typically comprises a surface acoustic wave (SAW) filter and low noise amplifier (LNA) which feed RF signals to an input splitter 201. The outputs from the splitter 201 provide the source for first and second quadrature low side injection mixers 206, 208, which are driven by a first local oscillator 210 at a frequency of LO=RF−100 kHz. The 100 kHz signal is selected to conform with the channel spacing requirements. A linear 90 degree phase shifter 212 assures a constant quadrature relation between the signals. As a consequence, where the local oscillator 210 is referenced to an analog cosine signal, the output of the first mixer 206 is of the frequencies:

−sin(RF−LO); and

−sin(RF+LO).

The output of the second mixer 208 is of the frequencies:

cos(RF−LO); and cos(RF+LO).

This means that both the wanted signal and the image mix down to 100 kHz. The outputs of the mixers 206, 208 each then feed into first and second low-pass filters 202, 203 to reject the respective signals −sin(RF+LO) and cos(RF+LO).

Figure 3:
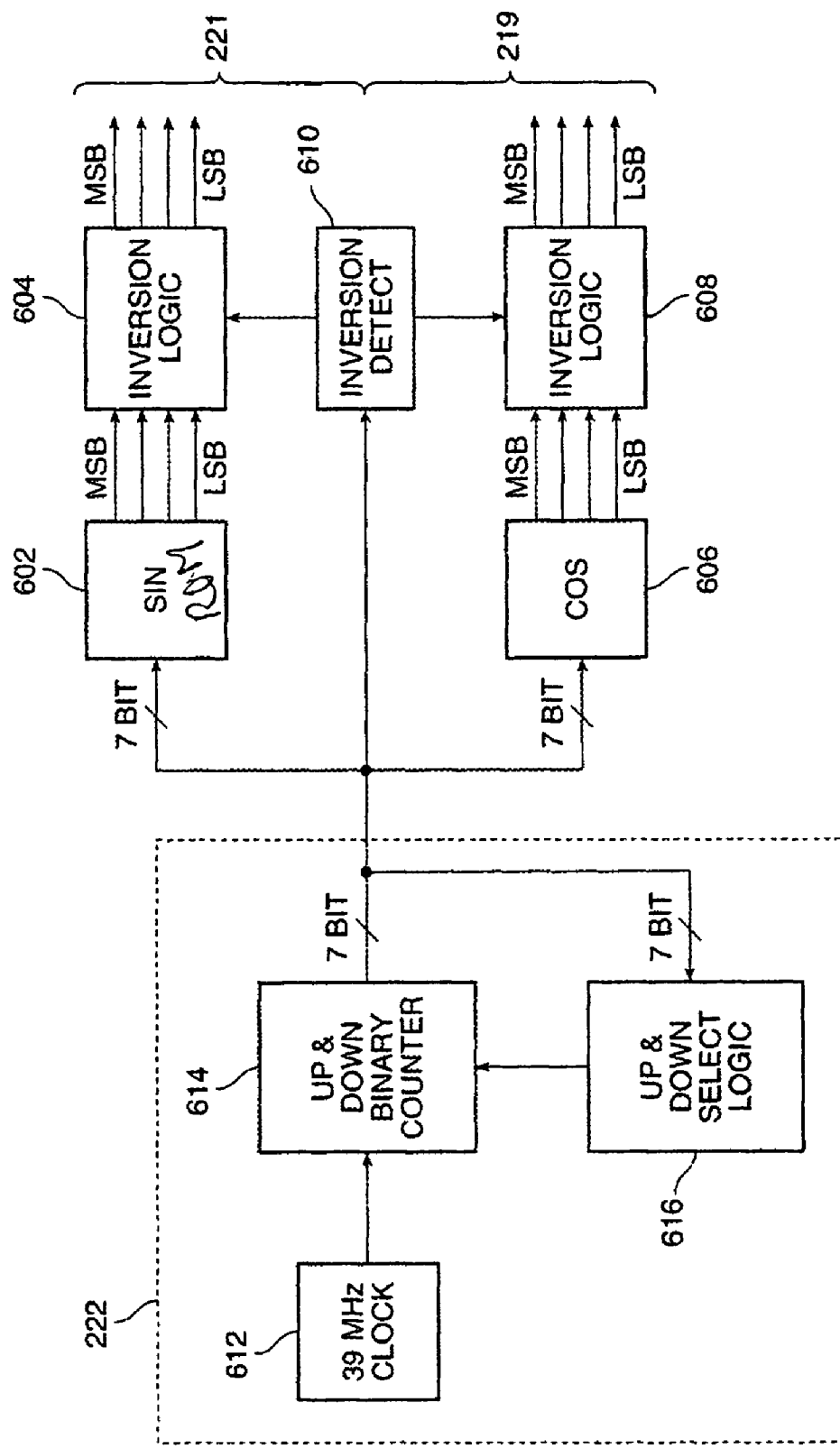
FIG. 3 is a block diagram of a cosine/sine generator suitable for use according to the invention.

After the filter 202, 203, the signals −sin(RF−LO) and cos(RF−LO) are fed to respective sigma-delta analog to digital converters 214, 216 to produce a single serial bit stream output. For the purposes of illustration only, the output is shown as two pairs of four parallel channels as hereinafter explained so they can interact with corresponding bits of sine and cosine tables 219, 221 over-clocked by a 39 MHz clock/counter 222. The clocked tables together define an effective second local oscillator to mix down the 100 kHz signal to baseband while rejecting the image. For purposes of explanation, the outputs of the sigma-delta converters 214, 216 are shown as four parallel lines each A, B, C, D and A', B', C' and D' corresponding to the Most Significant Bit to Least Significant Bit associated with the converter outputs. The bits are actually fed serially on a common line. These bits are synchronized to the bits supplied from the cosine table 219 and the sine table 221 by appropriate timing. The complete sine table and cosine for sixteen levels over one-quarter cycle is reproduced below in connection with the circuit of FIG. 3. These values are stored in memory locations or elements, as hereinafter explained.

| Table Loc. | Sine Table | | | | Cosine Table | | | |
|---|---|---|---|---|---|---|---|---|
| 1 | 1 | 0 | 0 | 0 | 1 | 1 | 1 | 1 |
| 2 | 1 | 0 | 0 | 0 | 1 | 1 | 1 | 1 |
| 3 | 1 | 0 | 0 | 0 | 1 | 1 | 1 | 1 |
| 4 | 1 | 0 | 0 | 0 | 1 | 1 | 1 | 1 |
| 5 | 1 | 0 | 0 | 0 | 1 | 1 | 1 | 1 |
| 6 | 1 | 0 | 0 | 0 | 1 | 1 | 1 | 1 |
| 7 | 1 | 0 | 0 | 1 | 1 | 1 | 1 | 1 |
| 8 | 1 | 0 | 0 | 0 | 1 | 1 | 1 | 1 |
| 9 | 1 | 0 | 0 | 1 | 1 | 1 | 1 | 1 |
| 10 | 1 | 0 | 0 | 0 | 1 | 1 | 1 | 1 |
| 11 | 1 | 0 | 0 | 1 | 1 | 1 | 1 | 1 |
| 12 | 1 | 0 | 0 | 1 | 1 | 1 | 1 | 1 |
| 13 | 1 | 0 | 0 | 1 | 1 | 1 | 1 | 1 |
| 14 | 1 | 0 | 1 | 0 | 1 | 1 | 1 | 1 |
| 15 | 1 | 0 | 0 | 1 | 1 | 1 | 1 | 1 |
| 16 | 1 | 0 | 0 | 1 | 1 | 1 | 1 | 1 |
| 17 | 1 | 0 | 1 | 0 | 1 | 1 | 1 | 1 |
| 18 | 1 | 0 | 1 | 0 | 1 | 1 | 1 | 1 |
| 19 | 1 | 0 | 1 | 0 | 1 | 1 | 1 | 1 |
| 20 | 1 | 0 | 0 | 1 | 1 | 1 | 1 | 1 |
| 21 | 1 | 0 | 1 | 1 | 1 | 1 | 1 | 1 |
| 22 | 1 | 0 | 1 | 0 | 1 | 1 | 1 | 1 |
| 23 | 1 | 0 | 1 | 0 | 1 | 1 | 1 | 1 |
| 24 | 1 | 0 | 1 | 0 | 1 | 1 | 1 | 0 |
| 25 | 1 | 0 | 1 | 1 | 1 | 1 | 1 | 1 |
| 26 | 1 | 0 | 1 | 0 | 1 | 1 | 1 | 0 |
| 27 | 1 | 0 | 1 | 1 | 1 | 1 | 1 | 1 |
| 28 | 1 | 0 | 1 | 1 | 1 | 1 | 1 | 0 |
| 29 | 1 | 0 | 1 | 1 | 1 | 1 | 1 | 1 |
| 30 | 1 | 0 | 1 | 1 | 1 | 1 | 1 | 0 |
| 31 | 1 | 0 | 1 | 1 | 1 | 1 | 1 | 0 |
| 32 | 1 | 0 | 1 | 1 | 1 | 1 | 1 | 0 |
| 33 | 1 | 1 | 0 | 0 | 1 | 1 | 1 | 0 |
| 34 | 1 | 0 | 1 | 1 | 1 | 1 | 1 | 0 |
| 35 | 1 | 1 | 0 | 0 | 1 | 1 | 1 | 0 |
| 36 | 1 | 0 | 1 | 1 | 1 | 1 | 1 | 0 |
| 37 | 1 | 1 | 0 | 0 | 1 | 1 | 1 | 0 |
| 38 | 1 | 1 | 0 | 0 | 1 | 1 | 1 | 0 |
| 39 | 1 | 1 | 0 | 0 | 1 | 1 | 0 | 1 |
| 40 | 1 | 1 | 0 | 0 | 1 | 1 | 1 | 0 |
| 41 | 1 | 1 | 0 | 0 | 1 | 1 | 0 | 1 |
| 42 | 1 | 1 | 0 | 0 | 1 | 1 | 1 | 0 |
| 43 | 1 | 1 | 0 | 1 | 1 | 1 | 0 | 1 |
| 44 | 1 | 1 | 0 | 0 | 1 | 1 | 0 | 1 |
| 45 | 1 | 1 | 0 | 1 | 1 | 1 | 0 | 1 |
| 46 | 1 | 1 | 0 | 0 | 1 | 1 | 1 | 0 |
| 47 | 1 | 1 | 0 | 1 | 1 | 1 | 0 | 1 |
| 48 | 1 | 1 | 0 | 1 | 1 | 1 | 0 | 1 |
| 49 | 1 | 1 | 0 | 0 | 1 | 1 | 0 | 0 |
| 50 | 1 | 1 | 0 | 1 | 1 | 1 | 0 | 1 |
| 51 | 1 | 1 | 0 | 1 | 1 | 1 | 0 | 1 |
| 52 | 1 | 1 | 1 | 0 | 1 | 1 | 0 | 0 |
| 53 | 1 | 1 | 0 | 1 | 1 | 1 | 0 | 1 |
| 54 | 1 | 1 | 0 | 1 | 1 | 1 | 0 | 0 |
| 55 | 1 | 1 | 0 | 1 | 1 | 1 | 0 | 1 |
| 56 | 1 | 1 | 1 | 0 | 1 | 1 | 0 | 0 |
| 57 | 1 | 1 | 0 | 1 | 1 | 1 | 0 | 0 |
| 58 | 1 | 1 | 1 | 0 | 1 | 1 | 0 | 0 |
| 59 | 1 | 1 | 0 | 1 | 1 | 1 | 0 | 0 |
| 60 | 1 | 1 | 1 | 0 | 1 | 1 | 0 | 0 |
| 61 | 1 | 1 | 1 | 0 | 1 | 1 | 0 | 0 |
| 62 | 1 | 1 | 1 | 0 | 1 | 0 | 1 | 1 |
| 63 | 1 | 1 | 1 | 0 | 1 | 1 | 0 | 0 |
| 64 | 1 | 1 | 1 | 0 | 1 | 0 | 1 | 1 |
| 65 | 1 | 1 | 1 | 0 | 1 | 1 | 0 | 0 |
| 66 | 1 | 1 | 1 | 0 | 1 | 0 | 1 | 1 |
| 67 | 1 | 1 | 1 | 0 | 1 | 0 | 1 | 1 |
| 68 | 1 | 1 | 1 | 0 | 1 | 0 | 1 | 1 |
| 69 | 1 | 1 | 1 | 1 | 1 | 0 | 1 | 1 |
| 70 | 1 | 1 | 1 | 0 | 1 | 0 | 1 | 1 |
| 71 | 1 | 1 | 1 | 1 | 1 | 0 | 1 | 1 |
| 72 | 1 | 1 | 1 | 0 | 1 | 0 | 1 | 0 |
| 73 | 1 | 1 | 1 | 1 | 1 | 0 | 1 | 1 |
| 74 | 1 | 1 | 1 | 0 | 1 | 0 | 1 | 0 |
| 75 | 1 | 1 | 1 | 1 | 1 | 0 | 1 | 1 |
| 76 | 1 | 1 | 1 | 1 | 1 | 0 | 1 | 0 |
| 77 | 1 | 1 | 1 | 1 | 1 | 0 | 1 | 1 |

-continued

| Table Loc. | Sine Table | | | | Cosine Table | | |
|---|---|---|---|---|---|---|---|
| 78 | 1 | 1 | 1 | 1 | 1 | 0 | 0 | 1 |
| 79 | 1 | 1 | 1 | 1 | 1 | 0 | 1 | 0 |
| 80 | 1 | 1 | 1 | 1 | 1 | 0 | 1 | 0 |
| 81 | 1 | 1 | 1 | 1 | 1 | 0 | 1 | 0 |
| 82 | 1 | 1 | 1 | 1 | 1 | 0 | 0 | 1 |
| 83 | 1 | 1 | 1 | 1 | 1 | 0 | 0 | 1 |
| 84 | 1 | 1 | 1 | 1 | 1 | 0 | 1 | 0 |
| 85 | 1 | 1 | 1 | 1 | 1 | 0 | 0 | 1 |
| 86 | 1 | 1 | 1 | 1 | 1 | 0 | 0 | 1 |
| 87 | 1 | 1 | 1 | 1 | 1 | 0 | 0 | 1 |
| 88 | 1 | 1 | 1 | 1 | 1 | 0 | 0 | 0 |
| 89 | 1 | 1 | 1 | 1 | 1 | 0 | 0 | 1 |
| 90 | 1 | 1 | 1 | 1 | 1 | 0 | 0 | 0 |
| 91 | 1 | 1 | 1 | 1 | 1 | 0 | 0 | 1 |
| 92 | 1 | 1 | 1 | 1 | 1 | 0 | 0 | 0 |
| 93 | 1 | 1 | 1 | 1 | 1 | 0 | 0 | 0 |
| 94 | 1 | 1 | 1 | 1 | 1 | 0 | 0 | 0 |
| 95 | 1 | 1 | 1 | 1 | 1 | 0 | 0 | 0 |
| 96 | 1 | 1 | 1 | 1 | 1 | 0 | 0 | 0 |
| 97 | 1 | 1 | 1 | 1 | 1 | 0 | 0 | 0 |
| 98 | 1 | 1 | 1 | 1 | 0 | 1 | 1 | 1 |

The clock/counter 222 comprises a 39 MHz clock 612, an up/down binary counter 614 which outputs a seven-bit address word, and an up vs. down logic selector 616 which reads the counter 614 output and reverses the count direction at peaks and at zero address positions.

The sine table 221 comprises an addressable memory such as a ROM 602 containing the values of the sine table above and inversion logic 604 for converting the values according to the appropriate quadrants of the cycle. The cosine table comprises an addressable memory such as a ROM 606 containing the values of the cosine table above and inversion logic for converting the values according to the same quadrants. Inversion detector 610 is shared with the inversion logic elements 604, 608 and reads the output of counter 614 to sense zero crossing positions and add the appropriate sign bit.

The two bit streams output from I and Q sigma-delta A/D converters 214, 216 are split and then each exclusive-ORed with both the corresponding sine function bits from sine table 221 and the cosine function bits from cosine table 219. Then the outputs of the XOR gates are each both ORed together and ANDed together. This Boolean product and this Boolean sum are then each binary weighted and combined in an reconstruction filter formed of weighting resistors that are combined with other weighted outputs to form respective analog I and Q channel signals at baseband.

In a specific embodiment according to the invention, a bank of pairs of digital signal mixers 223, 225; 323, 325; 423, 425; 523, 525 are provided using for example XOR gates 229, 231 with an AND gate 235 and an OR gate 233 in one of the pair, and further using XOR gates 237, 239 with an AND gate 243 and an OR gate 241 in the other of the pair.

The source digital oscillator supplying the digital signal mixers employs an oversampled digital word of four bits in length, all of which are binary weighted relative to one another, to achieve at least sixteen levels of accuracy for a sine wave mixing signal without significant phase or amplitude error. The mixer 223, 225 mixes the digitized serial bit stream from converters 214 and 216 according to the clock, at 39 MHz for example, with the output of the four-bit wide digital cosine/sine tables 219/221 representing the source oscillator by means of a simple exclusive OR at gates 229, 231, and the in-phase and quadrature signals are recombined digitally using a simple AND and OR summer 233, 235. For the Most Significant Bit (MSB) of the In-phase channel, one bit output of the converter 214 is XORed with the corresponding sin bit in the first XOR gate 229 and is simultaneously XORed with the corresponding cos bit in the second XOR gate 231. The output of the first XOR gate 229 is ORed in the first OR gate 233 with the output of the second XOR gate 231, while the output of the first XOR gate 229 is simultaneously ANDed in the second AND gate 235 with the output of the second XOR gate 231. The result is the desired I channel signal ready for analog scaling according to the weighting of the bit.

For the Most Significant Bit (MSB) of the Quadrature-phase channel, one bit output of the converter 216 is XORed with the corresponding cos bit in the third XOR gate 237 and is simultaneously XORed with the corresponding sin bit in the fourth XOR gate 239. The output of the third XOR gate 237 is ORed in the second OR gate 241 with the output of the fourth XOR gate 239, while the output of the third XOR gate 237 is simultaneously ANDed in the second AND gate 243 with the output of the fourth XOR gate 239. The result is the desired Q channel signal ready for analog scaling according to the weighting of the bit.

This configuration and operation is performed for each significant bit output from the converters 214, 216, effectively operating in parallel.

The output of the final gates are followed by binary weighting using weighting resistors of value R, 2R, 4R and 8R, corresponding to their respective binary values. Each channel is summed at a summing node 250, 252 coupled at respective capacitors 254, 256 serving as lowpass filters F1, F2. The resultant output is the analog I channel 258 with signal −cos(RF−LO−LO2) and Q channel 260 with signal −sin(RF−LO−LO2), both with desired image rejection.

The image rejection is typcially limited by the tolerance of the weighting resistors. While initial image rejection is as high as −35 dBc, once the first mixers have contributed their error, the image rejection is much less. It is thus better to do the summation digitally and then reconstruct the outputs into the filter afterwards. This method means that the image rejection is not affected by the resistor tolerance but only by the harmonic rejection of the sine and cosine table.

In the GSM band plan, the channel spacing is 200 kHz, which requires a quadrature second Local Oscillator frequency to be 100 kHz. A square wave at 100 kHz would mix down not only the wanted to baseband but all odd harmonics of the 100 kHz passband. The third harmonic (300 kHz) is the adjacent channel and the fifth harmonic (500 kHz) is the bi-adjacent channel. Thus, all channels are mixed to some degree into the wanted passband. The use of highly-accurate (16 level) oversampled sine/cosine table overcomes much of this problem.

The bandwidth of the reconstruction filters 254, 256 (FIG. 2) are not critical because they merely need to provide rejection of the high frequency switching noise in the MHz region. The pole should be set so that it does not attenuate the maximum 67 kHz deviation from the design bandwidth for GMSK but will provide maximum attenuation of all higher frequencies. This type of filter can be implemented either as an R-C circuit as illustrated or as a charge pump circuit feeding an external capacitor (not shown).

It has been found that even with blockers larger than allowed by the GSM 05:05 Specification they will not be mixed down to baseband to a degree where they will degrade performance. It has also been found that with −104 dBm input to the low IF receiver board the LO2 level is −8 dBc from the wanted. This is obtained without trying to correct for the sigma delta comparator DC bias level and offset voltage level. The image rejection has been measured at −17 dBc with no correction for the front end amplitude/phase errors and while using RC components in the sigma delta whose bandwidth tolerance is unknown. In any event, the number of gates required to implement the circuit is reduced by an order of magnitude.

The invention has been explained with reference to specific drawings and embodiments. Other embodiments will be evident to those of ordinary skill in the art. It is therefore intended that the invention not be limited except as indicated by the appended claims.

What is claimed is:

1. An image reject circuit apparatus comprising:

a first frequency downconversion circuit employing a first local oscillator for downconverting in-phase and quadrature signal components of a digitized communication signal to a first intermediate frequency;

sigma delta converters for generating an in phase digital bit stream and a quadrature phase digital bit stream;

a digital in-phase and quadrature phase second local oscillator;

mixing circuitry for mixing respective single serial digital bit stream in-phase signal and single serial digital bit stream quadrature phase signal through a set of logic gates to produce a digital representation of downconverted in-phase and quadrature components, the mixing circuitry comprising, for each significant bit:

first and second exclusive-OR gates coupled to receive as first input an in phase digital bit stream and as second inputs a high accuracy sine function bit stream and a high accuracy cosine function bit stream;

third and fourth exclusive-OR gates coupled to receive as first input a quadrature phase digital bit stream and as second inputs a high accuracy sine function bit stream;

first OR gate for logically adding the outputs of the first and second XOR gates for the in-phase channel;

first AND gate for logically multiplying the outputs of the first and second XOR gates for the in-phase channel;

second OR gate for logically adding the outputs of the third and fourth XOR gates for the quadrature phase channel; and second AND gate for logically multiplying the outputs of the third and fourth XOR gates for the quadrature phase channel;

weighting resistances in series with the outputs of the logic gates for combining the digital representation of the downconverted in-phase and quadrature components according to a value in an in-phase signal and in a quadrature phase signal; and reconstruction filters to recover in-phase and quadrature phase baseband signals from said downconverted in-phase and quadrature components substantially free of image artifacts.

* * * * *